United States Patent [19]

Juhala

[11] Patent Number: 5,764,675
[45] Date of Patent: Jun. 9, 1998

[54] DIODE LASER ARRAY

[76] Inventor: Roland E. Juhala, Six Gum Tree Pl., St. Charles, Mo. 63301

[21] Appl. No.: 678,171

[22] Filed: Jul. 11, 1996

Related U.S. Application Data

[63] Continuation of Ser. No. 269,070, Jun. 30, 1994, abandoned.

[51] Int. Cl.$^6$ .................................................... H01S 3/04
[52] U.S. Cl. .................................. 372/50; 372/36; 257/99
[58] Field of Search ................................ 372/50, 34, 35, 372/36, 75; 257/785, 773, 88.99

[56] References Cited

U.S. PATENT DOCUMENTS

| | | | |
|---|---|---|---|
| 5,099,488 | 3/1992 | Ahrabi et al. | 372/50 |
| 5,325,384 | 6/1994 | Herb et al. | 372/36 |
| 5,394,426 | 2/1995 | Joslin | 372/50 |
| 5,438,580 | 8/1995 | Patel et al. | 372/36 |

*Primary Examiner*—Rodney B. Bovernick
*Assistant Examiner*—Yisun Song
*Attorney, Agent, or Firm*—Henry W. Cummings

[57] ABSTRACT

The LAMPS module is a compact, back cooled, vertically stacked, two-dimensional, incoherent array of diode laser bars featuring all-soldered construction with partial collimation of the emitting diode laser light to form a laser power source that can be transformed into a laser line source of exceptional brightness. The array includes a diode laser unit which comprises a diode laser bar, an electrode, and a substrate soldered to a heat sink. The diode laser unit is joined by soldering to an electrical isolator plate, and the isolator plate is joined to a heat exchanger by soldering for removal of waste heat. The invention includes a method for forming the array and a heat exchanger for removing heat from the array.

34 Claims, 10 Drawing Sheets

DIODE LASER ARRAY

This application is a continuation of application Ser. No. 08/269,070, filed Jun. 30, 1994, now abandoned.

FIELD OF THE INVENTION

The invention relates to stacked diode laser bars.

BACKGROUND OF THE INVENTION

Within the last few years the semiconductor diode laser has been developed with continually increasing power output. It has been shown that very high power output can be obtained from a collection of these diode lasers by placing them in close proximity to each other. By way of doing this, first, the diode laser bar was invented which consists of a linear array of diode laser emitters made in a single monolithic structure. Next, these diode laser bars were placed in vertical stacks to form a two-dimensional array of diode laser emitters. In one respect it is desirable to have the diode laser emitters stacked as close as possible to each other in order to form a power source of high intensity. In this case the arrays would have a high packing factor, which shall be defined here as the ratio of the total area of all the diode bars in the array to the total frontal area of the array, including heat sinks, electrodes, insulation, stacking space, and structure. In the last few years two-dimensional arrays of diode laser bars have been made producing peak power in the range of 350 kW to 400 kW. These arrays have a high packing factor.

Inherent in the use of diode lasers is the need to remove heat generated during the process of excitation. Due to the nature of the construction of the 350 kW arrays (i.e. high packing factor, approximately 0.36) they have poor heat removal capability, and their average power capability is limited to about 1 kW, or in other words a duty factor of about 0.3%.

Many applications require operational duty factors of 10 to 25% as well as continuous or CW operation. It is for this latter purpose that the LAMPS module was developed. However, good heat removal requires lower packing factors, which for the LAMPS modules is approximately 0.02. By way of comparison 10 LAMPS modules containing a total of 120 diode laser bars can provide 1 kW of average laser power. Whereas, the large array mentioned above contains 7000 diode laser bars. Each of these array types have their own specific areas of application.

As with the large 350 kW array mentioned above it is desirable to be able to stack many high duty factor arrays, such as the LAMPS module, together. This requires a compact design with as high a packing factor as possible. Ultimately, the average power capability will be determined mainly by the design of the system with regard to heat removal capability. The LAMPS module incorporates a thermal design not found in other two-dimensional arrays. At the same time it is desirable to package the modules so they can be handled and are protected from the environment. The modules used in the 350 kW array are not so packaged, and they must be handled with great care to avoid any damage or contamination.

Maintaining electrical continuity through the 2-D stacks especially during thermal cycling has proven to be a problem. The diode bar units are simply pressed together and so rely on pressure contact for electrical continuity. Any slight film or oxide that exists on the surface can cause a loss of continuity.

Finally, due to the high cost of components used in the arrays, particularly the diode bars themselves, it is desirable to be able to repair the arrays without damage to the diode bars or other components. The LAMPS arrays are fully repairable, giving them lower life cycle costs.

In the past it has proven difficult to construct two-dimensional diode arrays that 1) have a high average power capability implying good heat removal, and 2) comprise a rugged, compact, and reliable design that can be constructed and maintained economically. The unique design features of the LAMPS arrays satisfy these requirements and has resulted in a device that has already been reduced to practise. These modules have demonstrated operation in both high average power pulsed modes and CW.

Figure 1:
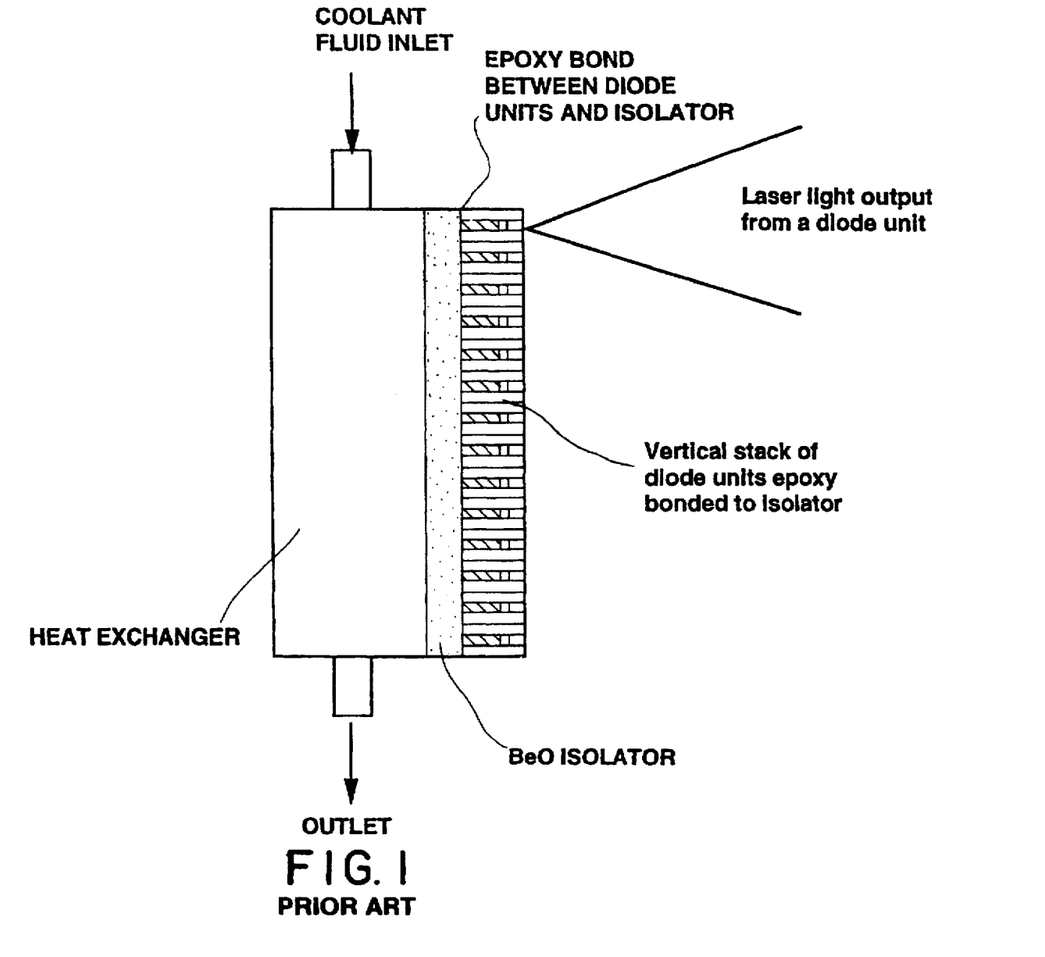
FIG. 1 is a side elevation view partly in section of a prior art structure known as a back cooled two-dimensional array.

There are two basic approaches that have been used to remove heat from vertically stacked two-dimensional diode laser arrays. One approach involves attaching a heat exchanger to the back edges of the vertical stack as shown in FIG. 1. This approach is commonly referred to as back cooling. The diode bars and their attached heat sinks must be electrically isolated from ground so that a current can pass through them in series and provide the excitation for the diode lasers. Because of this the attachment in back cooled arrays has been made with an epoxy adhesive. The best of these epoxies have poor thermal characteristics and severely limit the average power capability of the array.

Figure 2:
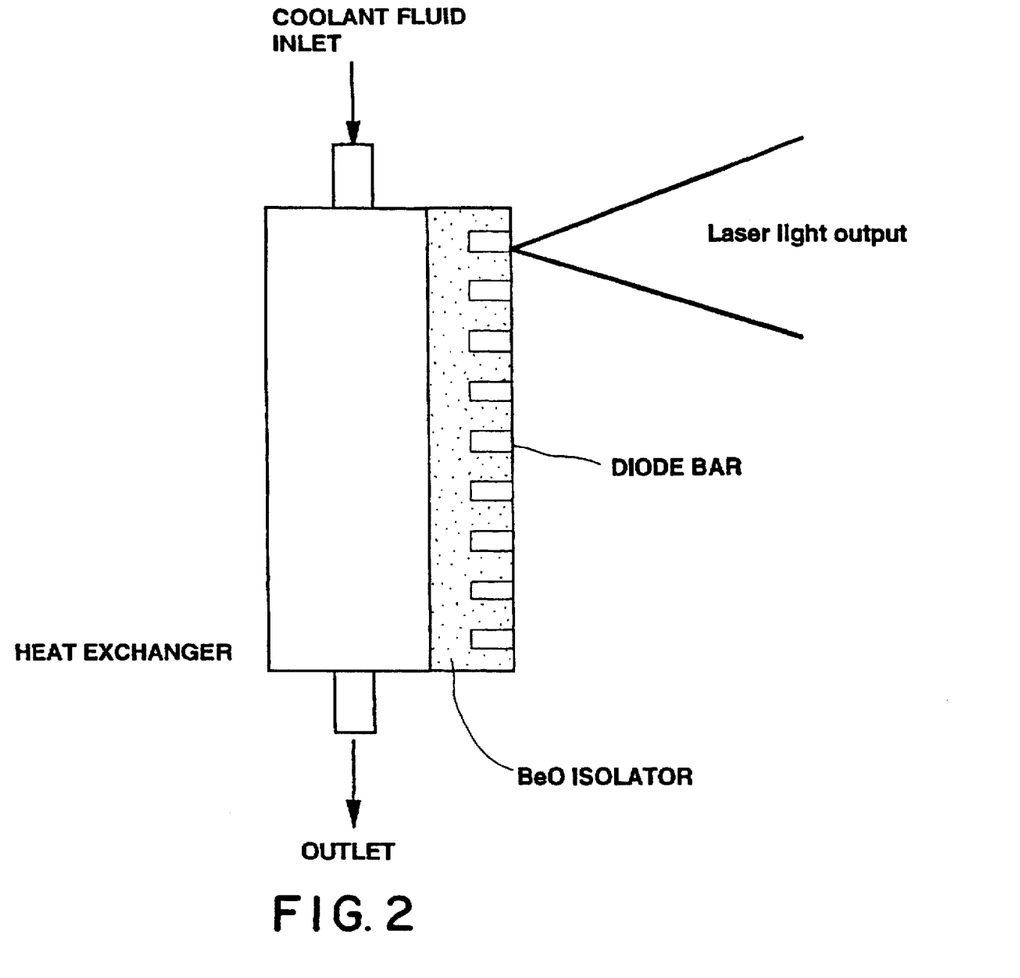
FIG. 2 is a side elevation view partly in section of another prior art structure with diodes soldered directly into an electrical isolator plate.

In one version of a back cooled 2-D array as shown in FIG. 2, the bars are mounted directly into slots cut in a beryllium oxide isolator. This approach has demonstrated a problem with stress buildup on the bars under thermal cycling and failure of the bar due to cracking. The LAMPS module avoids placing the diode bars in a position where stress can occur and is therefore resistant to failure during thermal cycling.

Figure 3:
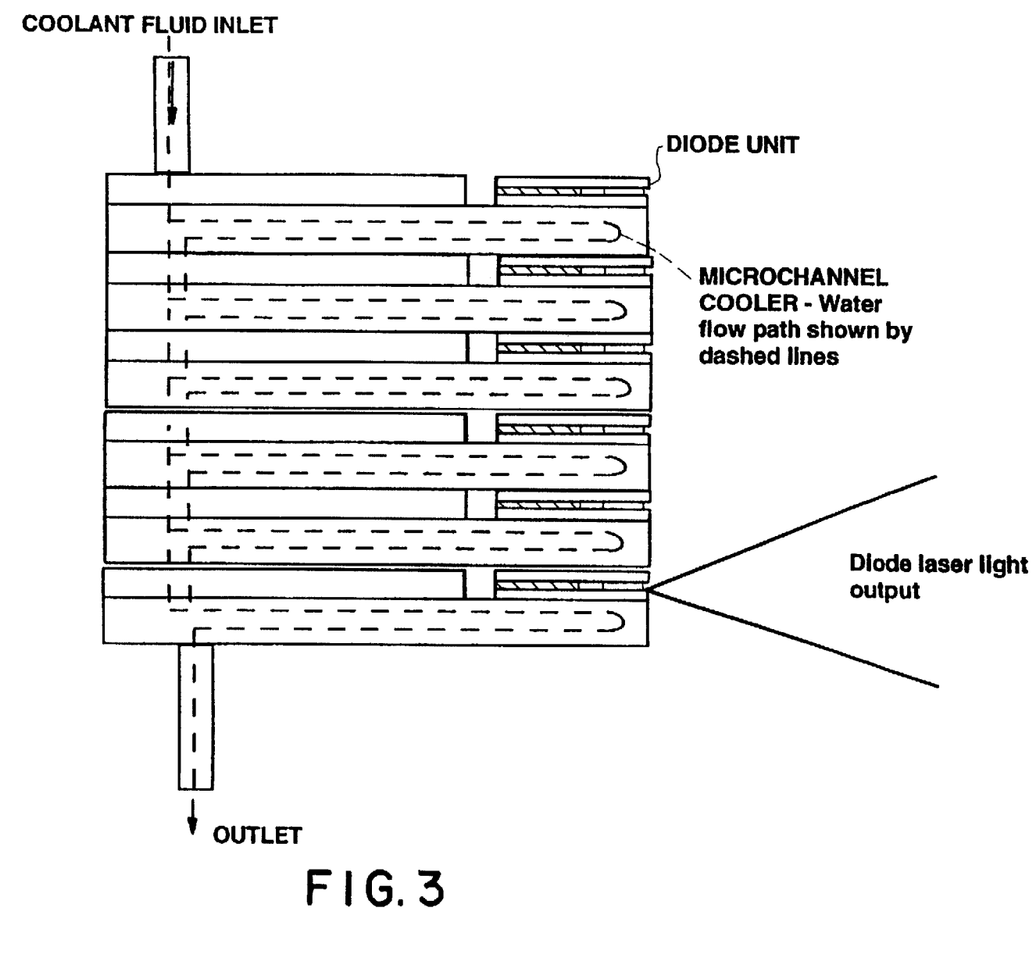
FIG. 3 is a side elevation view partly in section of a prior art laser array with diode units mounted on microchannel coolers to form a two-dimensional diode laser array.

The second approach used for heat removal has been to mount each diode bar unit directly over a thin heat exchanger commonly called a microchannel cooler as shown in FIG. 3. This places the bar in close proximity to the coolant fluid (often within ½ mm or so) and results in exceptional heat removal. In principle this technique can provide 2-D array operation at the highest power levels. The main problem with this technique is in sealing the four inlet and outlet openings on each and every microchannel cooler in such a way that it can survive environmental changes (temperature and vibration) without leaking the coolant fluid. Clearly the more bars that are in the stack, the more difficult this problem becomes. So far 2-D arrays made with microchannel coolers have been operated mainly in the laboratory. This technique is limited to a vertical packing density of about one diode bar per mm of stack height.

Maintaining electrical continuity is, of course, essential for operation of the device. The current must be able to pass from the top electrode of the first diode unit through all those that are stacked below it. The stacks are pressed together and rely on contact pressure to maintain continuity. In such a case any slight contamination is enough to break continuity through the stack.

The LAMPS arrays are designed to be used either as stand alone devices, or as part of a large matrix of modules. As stand alone devices they must be packaged so that they can be safely and easily handled. As part of a larger matrix of modules they must be compact with a good packing factor and at the same time be designed so as to afford access to cooling and electrical power connections and mounting points. Finally, the package should afford protection from normal contaminants found in most environments such as particulate matter consisting of smoke and dust.

SUMMARY OF THE INVENTION

The LAMPS module is a compact, back cooled, vertically stacked, two-dimensional, incoherent array of diode laser bars featuring all-soldered construction with partial collimation of the emitting diode laser light to form a laser power source that can be transformed into a laser line source of exceptional brightness. The array includes a diode laser unit which comprises a diode laser bar, an electrode, and a substrate soldered to a heat sink. The diode laser unit is joined by soldering to an electrical isolator plate, and the isolator plate is joined to a heat exchanger by soldering for removal of waste heat. The invention includes a method for forming the array and a heat exchanger for removing heat from the array.

DESCRIPTION OF THE PREFERRED EMBODIMENTS

Figure 4:
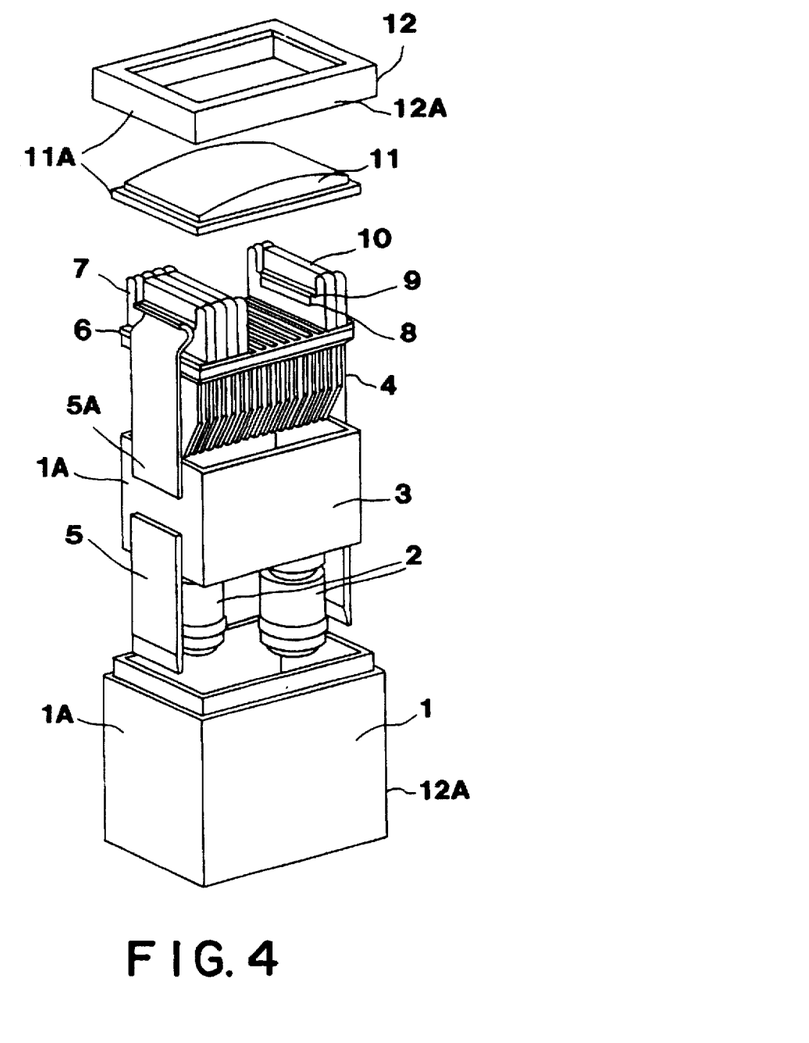
FIG. 4 is a schematic perspective view of the LAMPS module of the present invention.
Figure 7:
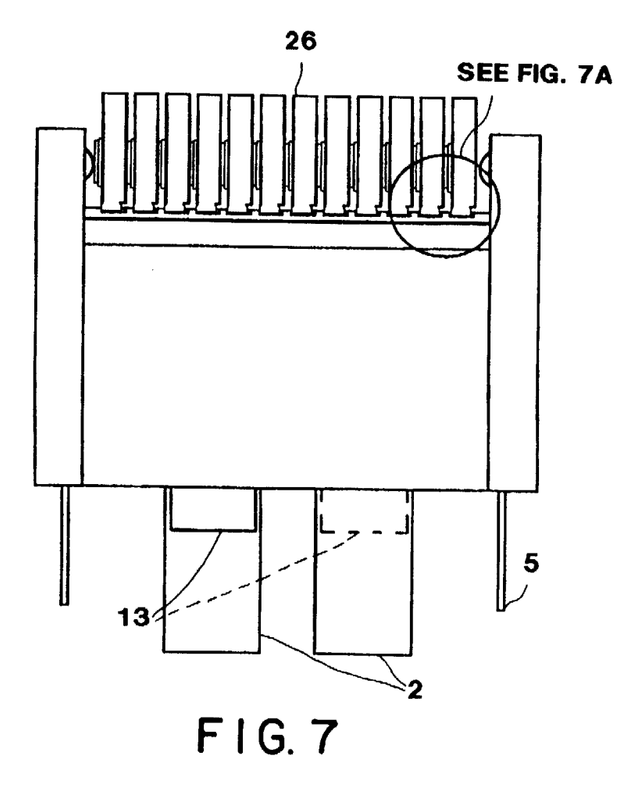
FIG. 7 is a schematic side elevation view of the LAMPS two-dimensional quasi-collimated diode laser array of the present invention.

In reference to FIG. 4 the module comprises an outer housing 1, coolant fittings 2, heat exchanger lower structure 3, heat exchanger finned lid 4, electrical power lead 5 and electrical power contact 5A, electrical isolator 6, heat sink 7, low contact pressure electrode 8, diode bar package 9, lens 10, lens/window 11, housing cap 12, and support posts 13 (hidden from view on underside of heat exchanger structure, but, can be seen in FIG. 7). The electrical power lead 5 and electrical power contact 5A may be combined as one piece.

Figure 5A:
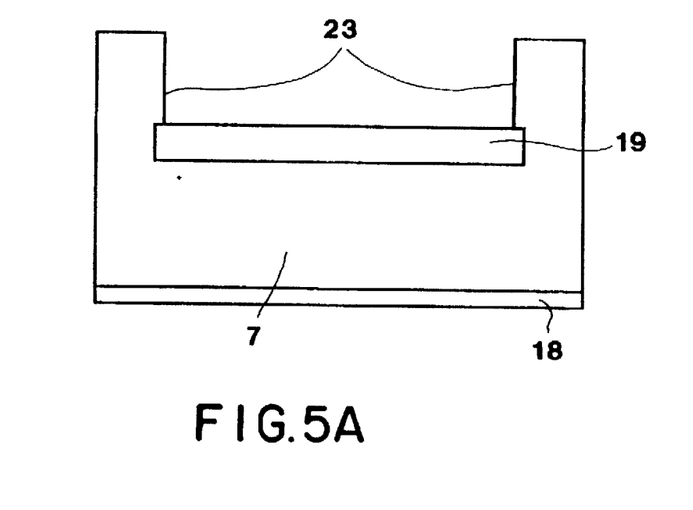
FIG. 5A is a bottom view of the LAMPS heat sink of the present invention.
Figure 5B:
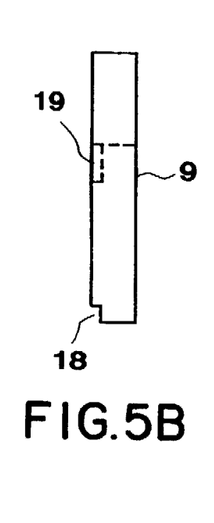
FIG. 5B is an end view of the LAMPS heat sink of the present invention.
Figure 6A:
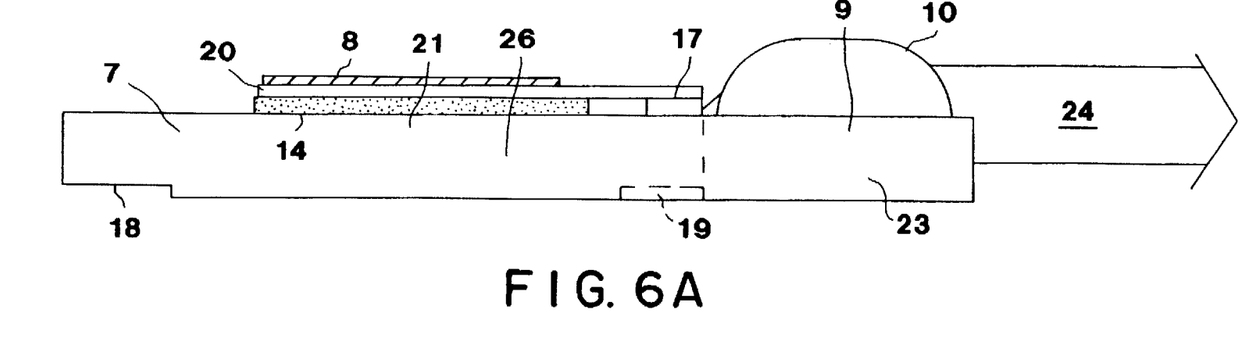
FIG. 6A is a side elevation view of the LAMPS diode laser units with diode bar package, collimating lens, and heatsink.

At the heart of the LAMPS module is the diode unit 26 which will be described in reference to FIGS. 5 and 6. The diode unit comprises a heat sink 7, diode bar package 9, and low contact pressure electrode 8. The heat sink 7 provides the base on which to mount the diode bar package 9. The preferred material for the heat sink is copper since it has excellent thermal and electrical conductivities and good solderability. Gold and silver may also be used for the heatsink. The heat sink has several features which allow the assembly to take place properly. First, there are 2 notches 18 and 19 shown in FIG. 5. The upper notch 19 provides the clearance between bars in the stack so that substantially no stress buildup occurs on the diodes when the stack is compressed or during thermal cycling. Clearance between adjacent diode units can also be provided by a step in the lid 16 where the lid is attached to the bar (FIG. 6B), or it can be provided by the thickness of the low contact pressure electrode 8 (FIG. 6A) since the electrode does not extend over the region of the diode laser bar.

The lower notch 18 allows for clearance and tolerance buildup during stacking. The same thing may be accomplished by simply making the heat sink thinner but this would then detract from the capability to remove heat.

The heat sink also has two ears 23 protruding beyond the bar package. These are for mounting a cylindrical microlens 10 for partial collimation of the laser light. It is essential to have the collimating lens and diode bar mounted on the same substrate since the slightest motion between them during operation will quickly degrade the collimation of the laser light 24 (FIG. 6A).

One assembly for the diode bar package 21 comprises a diode laser bar 17, lid 20, insulating spacer 14, and low contact pressure electrode 8 mounted directly on the heat sink 7 (as shown on FIG. 6A) forming the diode unit 26. Alternately, the diode bar may be packaged using a separate substrate 15 as shown in FIG. 6B. The diode bar package 9 then comprising the bar 17, lid 16, substrate 15, and insulating spacer 14. The complete diode package 22 is formed by soldering or welding the low contact pressure electrode to the lid 16 in the diode bar package 9. The diode package 22 is then soldered to the heat sink 7 forming the diode unit 26.

Figure 6B:
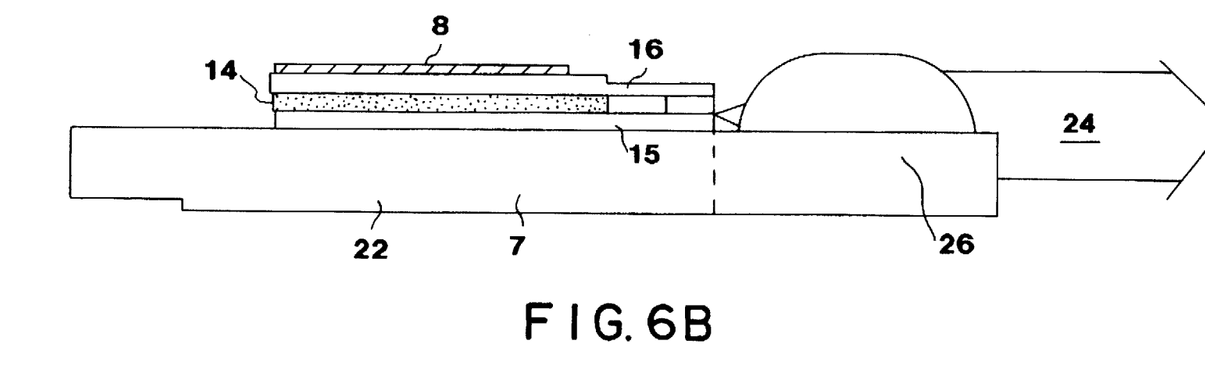
FIG. 6B is a side elevation view of another embodiment of the LAMPS diode laser units with diode bar package, collimating lens, and heatsink.
Figure 6C:
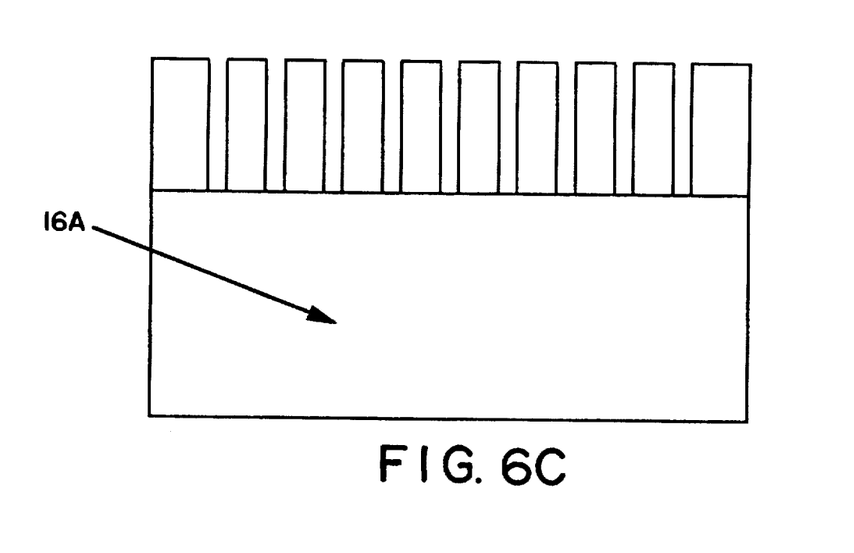
FIG. 6C is a top view of a slotted lid used in the diode bar package.

An alternate concept 16A for the lid 16 shown in FIG. 6B is to include slots as shown in FIG. 6C. These slots relieve strain along the width of the lid and thus reduce the tendency for the lid to lift off the diode bar during thermal expansion and contraction. The slots are at right angles to the length of the diode bar. The space between the slots may be approximately 0.001 to 0.010 inches and the width of the slots may be 0.04 to 0.10 inches. The slots will also tend to wick up excess solder that may be present when the diode bar is joined to the lid and substrate thus alleviating the tendency for the excess solder to bridge between the lid and substrate and short circuit the electrical path through the bar The length of the slots should be at least 2 bar widths. The slots may be formed by etching using techniques known to the art.

Figure 7A:
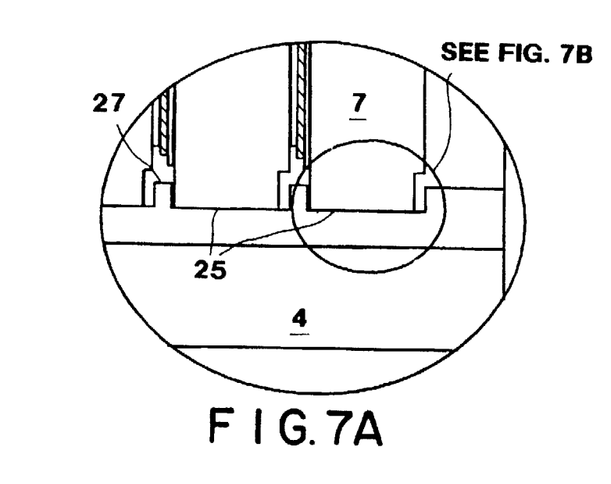
FIG. 7A is a detailed view of a portion of FIG. 7 illustrating the relationship between the heatsink and the isolator of the present invention.
Figure 7B:
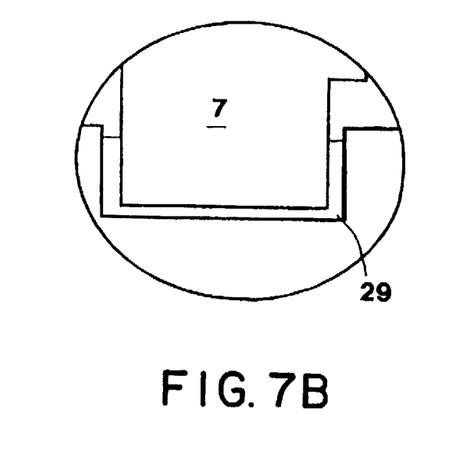
FIG. 7B is another detailed view of the same portion of FIG. 7 partly in section illustrating the solder connection between the heatsink and the isolator.

With the diode package 22 attached to the heat sink, the diode unit 26 is then stacked into a two-dimensional array as shown in FIG. 7. The diode units are placed into flat bottomed grooves 25 (FIG. 7A) cut into a beryllium oxide (BeO) isolator plate 6 which has been metallized for soldering as shown in FIG. 7B. Beryllium oxide is chosen because of its high thermal conductivity and its high electrical resistivity. Any material having high thermal conductivity and high electrical resistivity may be used. Another material that may be used is diamond. The metallization process can be done by various techniques known to the art.

The beryllium oxide isolator plate 6 is attached directly to the heat exchanger lid 4 by metallizing its bottom surface and soldering to the top surface of the lid 4 prior to stacking and soldering the diode units in place.

The grooves in the beryllium oxide serve two important functions in the LAMPS module. first. they contain the solder and prevent spillover into adjoining grooves and heatsinks. Without the grooves it would be difficult to keep the solder 29 from running between the heatsinks and, thereby, shorting them out. The separation ridges 27 between the grooves provide electrical isolation between diode units. This is the principal factor to be considered in determining the depth of the grooves 25. The groove depth in the preferred embodiment is approximately ¼ mm, however, a variation of 30% or so should still be acceptable. Second, the grooves allow the solder to fill up around the sides of the heatsink 7, thus, forming a stronger bond to the isolator. This also provides enhanced thermal contact between the isolator 6 and the heatsinks 7.

Soldering the diode units 26 to the beryllium oxide isolator plate 6 is the final soldering step in the construction of the LAMPS module. The thermal path for heat removal contains only soldered joints with thermal conductance many times greater than epoxy bonds. The all-soldered construction is readily repaired simply by reheating to the melt point of the solder 29 and removing the diode units. This does not disturb any of the other solder bonds since the solder 29 has the lowest temperature melt point compared to the remaining soldered joints. This is in contrast to those concepts which use epoxy bonds or mount the diodes in grooves on a single substrate as in FIG. 2. Such devices can only be repaired with great difficulty, if at all.

The LAMPS modules can be built with any reasonable number of diode units. At present they have been built with as many as 20 and as few as 8. The current and preferred embodiment of the module features 12 diode units. One of these 12 diode modules will provide up to 100 W CW, or 1000 W pulsed. This is a useful laser power output for various applications. There is a practical limit imposed by the manufacturability of the device that is probably less than 50. As mentioned above allowance for tolerance buildup must be provided for assembly. Too much allowance reduces thermal conductance and too little causes problems in assembly. Experience has shown that a ¼ mm of total clearance between the width of heat sink base and the width of slot in the BeO isolator allows for adequate margin in a 10 to 15 diode unit stack.

During the process of soldering the diode units to the electrical isolator 6, pressure is placed downward to seat the heat sinks firmly in the grooves and also along the length of the stack to cause each diode unit to come into electrical contact with those adjacent. This places the diode bars in series electrically. The amount of pressure to be used along the length of the stack is important. Too great a pressure will cause the bond between the diode units and the beryllium oxide to weaken as the pressure is removed. Too little pressure can result in loss of electrical continuity along the stack. Experience has shown that an acceptable pressure is 40 to 50 lbs/sq-in.

In order to insure good electrical contact between diode units two other unique design features may be employed. First, a low contact pressure electrode 8 comprising a gold plated screen is attached to the lid of the diode bar package by soldering or welding. This screen is of a fine mesh, typically 0.002 to 0.003 inches thick, and has by its very nature a roughness that bites into the adjoining surface breaking through any insulating films or oxides that may be present even when only modest pressure is exerted. The preferred screen material is gold plated stainless steel since it will maintain its elasticity under compression insuring pressure contact between the diode units. Other nickel steel alloys or copper and copper alloys plated with corrosion inhibiting metals such as gold or rhodium may be used for the screen.

The second novel design technique to further guarantee electrical contact is to place a drop of a composite metal comprising 62.5% gallium, 21.5% indium, and 16% tin on the top surface 28 of the electrode (as shown in FIG. 6B) which essentially wets the surface and insures good electrical contact even with little or no pressure along the stack. A metal of this type is known as Indalloy 51, as manufactured by the Indium Corporation of America. Other alloys of this type containing varying amounts of these constituents may be suitable. The advantage of using the screen with the Indalloy is that the screen mesh prevents the Indalloy from migrating on the surface due to vibration. The Indalloy 51 material remains in a unique liquid state down to 10.7° C. and has good electrical conductivity. There is a family of Indalloy materials and several of them would probably work in this application. Since the Indalloy is liquid it will not add to the stack length such as a piece of soft foil would tend to do. The screen and Indalloy in combination or separately. The preferred embodiment is to use them both in combination.

The modules are intended to be used as stand alone devices or in a large matrix containing many devices. The design of the module package reflects this dual requirement in several ways. As can be seen in FIG. 4 the inclosing structure comprising the heat exchanger lower structure 3, an outer housing 1, housing cap 12, and window/lens 11. The outer housing 1 is sealed to the heat exchanger structure 3 before the diode units are attached, and the housing cap 12 with the window/lens 11 already sealed into it, is sealed to the housing 1.

The seals may be made with low outgassing silicone rubber products or a number of other common glue materials as, for example, UV cement. The sealed housing forms a protective and clean environment for the diode array. Although the housing components may be fabricated by machining, the preferred method of construction is by injection molding.

The outer housing 1, which contains the electrical power leads 5, is in place while the diode units are being soldered to the heat exchanger. During this process the electrical power contacts 5 supply the pressure via mechanical fasteners along the stack to insure electrical continuity through the array. Following this soldering process the stack is cleaned and tested before attachment of cylindrical microlenses 10. The microlenses 10 collimate the laser emission in the direction in which the divergence is greatest. The housing cap 12 containing either a flat window or a transforming lens is then attached to the outer housing 1 and sealed. The transforming lens, instead of the flat window, would be used in applications where it is desirable to bring the collimated light to a narrow line focus.

Figure 8:
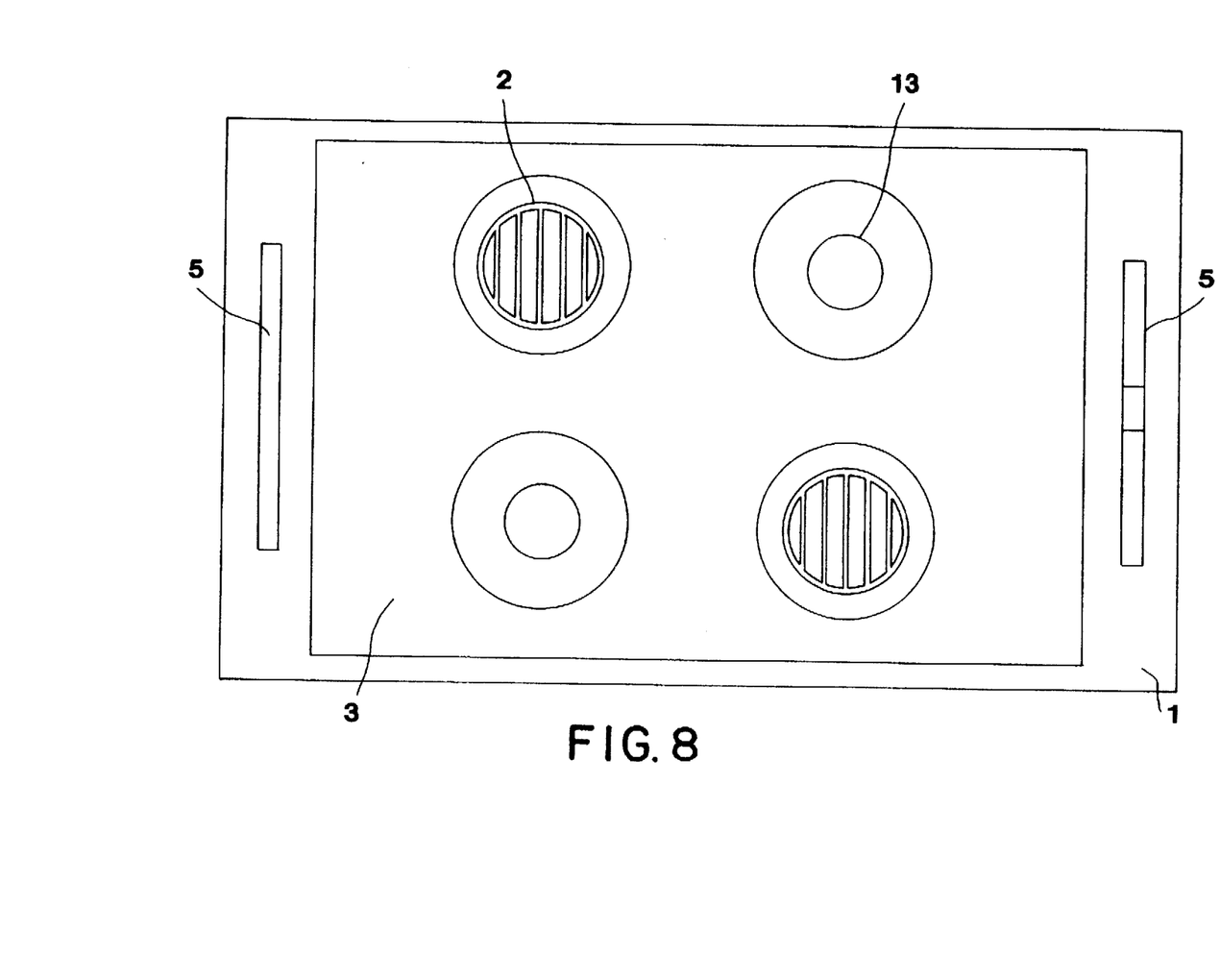
FIG. 8 is a bottom view of the heat exchanger of the present invention showing electrical connections, cooling ports, and mounting points.

The features of the LAMPS module lend themselves well to use in a matrix. In FIG. 8, which shows the backside of the module, it is seen that the coolant fittings 2, electrical power leads 5, and support posts 13 are all mounted so as to enable the frontal cross-sectional area to be kept as small as possible. The placement or these components keeps the heat exchanger length nearly equal to the length of the diode unit stack for overall compactness. These are special design features in a finned type of heat exchanger described below.

It is not necessary, however, to use a finned style heat exchanger as part of the LAMPS module. Other impingement type heat exchangers may be used.

The interior of the heat exchanger can be seen broken apart into lid 4 and lower structure 3 in FIG. 4. In this view it can be seen that the cooling fins are lined up parallel to the heat sinks of the diode units. More commonly they are lined up parallel to the length of the stack. By using this alignment approach instead, the coolant leads can be kept inside the length of the diode unit stack.

Figure 9:
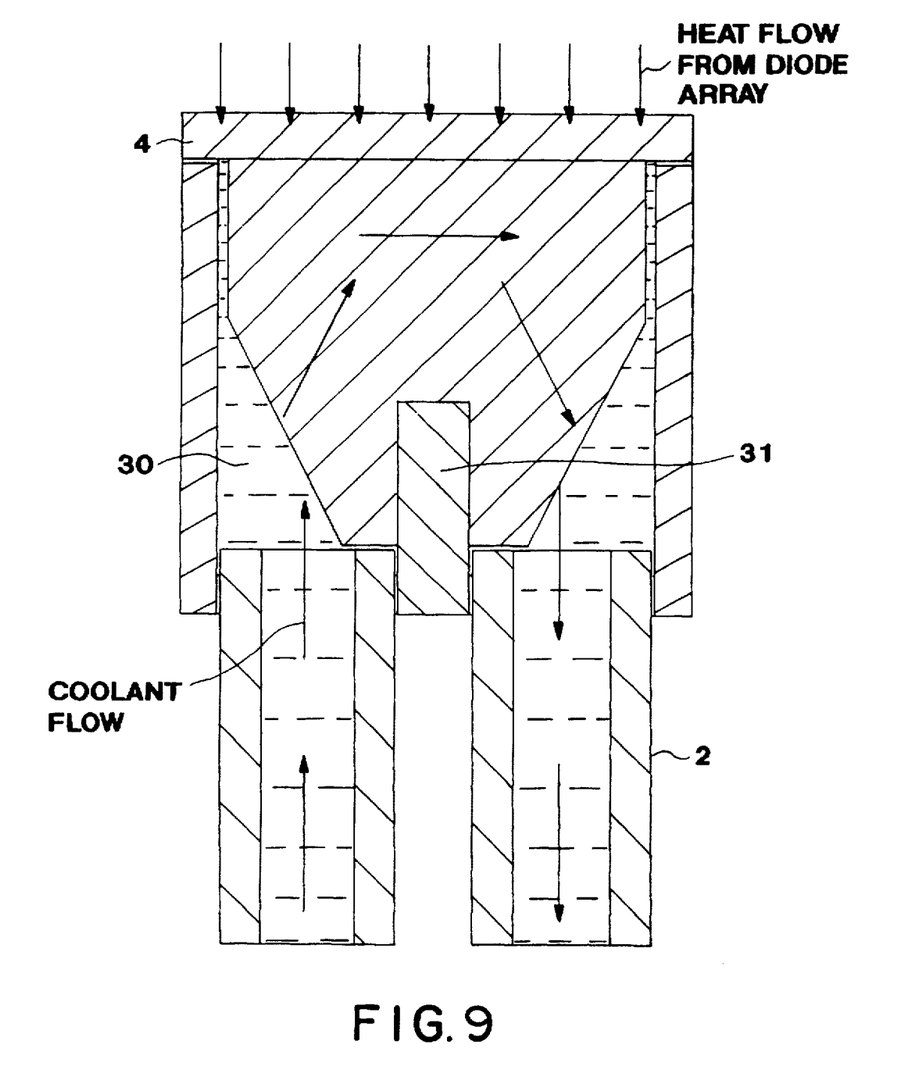
FIG. 9 is a schematic side elevation sectional view illustrating the water path through the heat exchanger of the present invention.

Two modifications to the finned structure will be described in reference to FIG. 9. First, a triangular piece was removed from both corners of the fins forming a header region 30 inside the exchanger where the water pressure can equalize and provide uniform flow to all the fins. Next in order to insure good flow past the fins where they join the lid a slot was cut down the center of the fins and a rib machined into the housing forming a baffle 31 to direct the flow toward the lid. The directed flow path through the interior of the heat exchanger is shown schematically in FIG. 9.

This arrangement provides substantially uniform heat removal which is needed to provide uniform temperature along the diode bar and consequently uniform wavelength emission. This design permits a shorter, more compact device with better overall packing factor making the module attractive for use in matricies of arrays.

The device is operated by supplying current to the input and output electrical power leads 5, FIG. 8 (which are shown here as polarized to prevent connecting them incorrectly), and providing a coolant to the inlet and outlet coolant tubes 2. Laser light is emitted from the diode bars 17, collected by the cylindrical microlenses 10 and emitted through the window or transforming lens 11. The modules may be constructed in lengths containing more or fewer diode laser bars.

There are now in existence a variety of semiconductor materials that permit lasing. Any of these materials that lend themselves to bar construction may be used as the lasing element in the LAMPS module. In the same vein, as the lasing materials improve they can be used in these modules using the same techniques and processes described herein.

Applications for these modules include but are not limited to materials processing and laser pumping. They have already demonstrated their utility in the formation of tape wound composite materials and paint stripping.

A transforming lens instead of the window in the housing cap can be used to focus the laser light into an intense line source. This source can be focussed into a line several centimeters away from the arrays. Therefore, the line sources from a matrix of these modules can be overlapped at a distance well away from the array. This provides a way of increasing the intensity of the line source by up to 2 orders of magnitude more than could be obtained from an individual module.

Placing many such modules into matricies to provide increased intensity is an intended use of these modules.

What is claimed is:

1. An array of diode bars providing a beam of laser radiation comprising:
   a stack of diode units, with each diode unit comprising:
      a diode laser bar having a diode upper surface and a diode lower surface;
      a lid having a front portion and a back portion and a lid upper surface and a lid lower surface;
      said lid lower surface at least partially engaging said diode upper surface;
      a heat sink located below said diode bar and said lid;
      said diode bar lower surface transferring heat to said heat sink;
      said bar upper surface transferring some heat to said lid lower surface;
      an electrically insulating spacer having a spacer upper surface and a spacer lower surface located below said lid and above said heat sink;
      said lid lower surface transferring heat to said spacer upper surface;
      electrical contact means including an electrode attached to said lid upper surface;
      said spacer lower surface transferring only heat from said lid to said heat sink;
      said heat sink having means thereupon for transferring heat to a heat exchanger;
      and a soldered joint joining said heat sink to said heat exchanger for removal of waste heat.

2. The array according to claim 1 wherein said heat sink has means for attaching a collimation or focussing cylindrical lens or binary optic.

3. An array according to claim 2 wherein said means for attaching comprises forward protrusions on the heat sink to which said optic is attached; said heat sink then extending rearward beyond the depth of the diode laser bar package to allow attachment to the electrical isolator plate by soldering without interfering with the electrode of the diode laser package.

4. An array according to claim 1 including means for providing clearance between successive diode laser bars.

5. An array according to claim 4 wherein the means for providing clearance comprises a notch on the heat sink over the area of the adjacent diode bar.

6. The array of claim 4 wherein said isolator plate contains grooves and wherein said diode units are sized so that the diode bars are not captive in said grooves in said isolator plate, and thus clearance exists between the diode laser bars in adjacent diode units.

7. The array according to claim 6 wherein said isolator plate grooves are generally square or rectangular.

8. An array according to claim 6 wherein the means for providing clearance comprises a notch on a back portion of said heat sink to allow clearance to both fit into said grooves on said isolator plate and provide for clearance to account for accumulated buildup of tolerance.

9. An array according to claim 8 wherein said isolator plate comprises a thin rib of material separating each groove.

10. An array according to claim 9 wherein said grooves are covered with metallic plating on the bottom and a portion of the vertical sides only.

11. An array according to claim 1 wherein said lid is formed thinner in the upper portion over the diode bar to provide clearance between adjacent diode bars.

12. An array according to claim 1 wherein said electrode comprises a fine mesh metallic screen upon said lid.

13. An array according to claim 12 wherein said screen is plated to resist corrosion and provide electrical contact.

14. An array according to claim 12 wherein said screen fits over said back portion of said lid only, and does not extend over said front portion of said lid.

15. An array according to claim 1 including an outer housing having a lower half containing electrical connector means for delivering power to the diode units.

16. An array according to claim 15 wherein said housing provides means for compressing the diode units to apply pressure to the stack and establish electrical continuity.

17. An array according to claim 16 wherein the means for compressing comprises mechanical fasteners in the housing.

18. An array according to claim 16 wherein said housing includes an upper half which contains an optic comprising a window or lens.

19. An array according to claim 18 wherein said upper half is sealed to said lower half forming a sealed junction to prevent intrusion of foreign particulate matter.

20. An array according to claim 1 wherein an isolator plate engages said heat exchanger comprising coolant tubes and support points mounted on a lower side of said heat exchanger and said heat exchanger is located within the area defined by the length and width of the diode stack and whereby waste heat is removed from the diode array.

21. The two-dimensional diode laser array assembly of claim 1 wherein the diode laser bar package comprises an electrode and diode bar is affixed directly to said heat sink without a substrate.

22. An array according to claim 12 wherein a high wetting conductive and low melting point material is placed on the screen to increase the reliability of the electrical contact between the adjacent diode laser units under conditions of low stack pressure.

23. An array according to claim 22 wherein said material comprises an alloy comprising gallium in the range of 62.5% to 95%, and indium in the range of 21.5% to 5%, and tin in the range of 16% to 0%.

24. A two-dimensional diode laser array assembly according to claim 1 wherein an Indalloy metallic material is applied to said lid of the diode bar package.

25. An array according to claim 20 wherein said heat exchanger comprises an outer housing and a heat exchanger lid with fins formed into it, with said lid being attached to said outer housing by welding, brazing, or soldering.

26. An array according to claim 25 wherein said fins are arranged so that they are parallel to the large plane of the heat sink, and said fins are contoured to include headers on the inlet and outlet sides so that coolant flow is substantially uniform within the fins.

27. An array according to claim 26 including a baffle located at right angles to the plane of the fins, said baffle protruding into a slot cut through the middle of the fins; said baffle connected to the inside of the outer housing to assist in directing the coolant flow through the space between the fins in close proximity to the portion of the fins nearest to their attachment point on the lid.

28. An array according to claim 1 wherein said lid includes slots located in said upper portion.

29. An array of diode bars according to claim 1 wherein said insulating spacer is spaced from said diode bar.

30. An array of diode bars providing a beam of laser radiation comprising:
   a stack of diode units, with each diode unit comprising:
      a diode laser bar having a diode upper surface and a diode lower surface;
      a lid having a front portion and a back portion and a lid upper surface and a lid lower surface;
      said lid lower surface at least partially engaging said diode upper surface;
      a heat sink located below said diode bar and said lid;
      said diode bar lower surface transferring heat to said heat sink;
      said bar upper surface transferring some heat to said lid lower surface;
      an electrically insulating spacer having a spacer upper surface and a spacer lower surface located below said lid and above said heat sink;
      said lid lower surface transferring heat to said spacer upper surface;
      electrical contact means including an electrode attached to said lid upper surface;
      said spacer lower surface transferring only heat from said lid to said heat sink;
      said heat sink having means thereupon for transferring heat to a heat exchanger.

31. An array of diode bars according to claim 30 wherein said insulating spacer is spaced from said diode bar.

32. An array according to claim 30 wherein said lid includes means for relieving stress between said diode and said lid.

33. An array according to claim 32 wherein said means for relieving stress between said diode and said lid comprises slots in said lid.

34. An array according to claim 30 wherein said diode bar has a substrate which engages said heat sink and said insulating spacer.

* * * * *